United States Patent [19]

Gordon

[11] E Patent Number: Re. 31,708

[45] Reissued Date of Patent: Oct. 16, 1984

[54] METHOD OF DEPOSITING ELECTRICALLY CONDUCTIVE, INFRA-RED REFLECTIVE, TRANSPARENT COATINGS OF STANNIC OXIDE

[76] Inventor: Roy G. Gordon, 22 Highland St., Cambridge, Mass. 02138

[21] Appl. No.: 510,967

[22] Filed: Jul. 5, 1983

Related U.S. Patent Documents

Reissue of:

[64] Patent No.: 4,146,657
Issued: Mar. 27, 1979
Appl. No.: 737,064
Filed: Nov. 1, 1976

[51] Int. Cl.[3] ..... H01B 1/08; H05B 3/14

[52] U.S. Cl. ..... 427/126.2; 427/74; 427/109; 427/166; 427/255; 427/255.3; 428/432

[58] Field of Search ..... 136/256, 261; 427/74, 427/109, 126.2, 166, 255, 255.3; 428/432

[56] References Cited

U.S. PATENT DOCUMENTS

| | | | |
|---|---|---|---|
| 2,566,346 | 9/1951 | Lytle et al. | 427/314 X |
| 3,107,177 | 10/1963 | Saunders et al. | 427/314 |
| 3,677,814 | 7/1972 | Gillery | 428/432 X |
| 3,949,146 | 4/1976 | Kane et al. | 427/255.3 X |

*Primary Examiner*—Michael R. Lusignan

[57] ABSTRACT

Electrically-conductive films of tin oxide are prepared by a novel process utilizing gaseous chemical compounds which react to form a tin-fluorine bond at a temperature which is (1) high enough so that the newly-created tin-fluorine bond-bearing molecule remains in the vapor-phase; and (2) low enough so that oxidation of the molecule occurs only after the indicated rearrangement. Films prepared by the process of the invention are characterized by surface resistances as low as 1 ohm per square when the film thickness is as thin as about a micron. These films are also characterized by extremely good reflectance of infrared radiation.

55 Claims, 7 Drawing Figures

METHOD OF DEPOSITING ELECTRICALLY CONDUCTIVE, INFRA-RED REFLECTIVE, TRANSPARENT COATINGS OF STANNIC OXIDE

Matter enclosed in heavy brackets [ ] appears in the original patent but forms no part of this reissue specification; matter printed in italics indicates the additions made by reissue.

FIELD OF THE INVENTION

This invention relates to an improved process for the production of electrically-conductive layers which are highly transparent to visible light and highly reflective to infrared light, and to the particularly advantageous coatings formed therewith. Such layers are useful as transparent electrodes for solar photovoltaic cells, photoconductive cells, liquid crystal electro-optical displays, photoelectrochemical cells, and many other types of optical-electronic devices. As transparent electrical resistors, such layers are used for defrosting windows in airplanes, automobiles, etc. As heat-reflecting transparent coatings on glass, these layers enhance the efficiency of solar thermal collectors and of windows in buildings, ovens, furnaces, and sodium-vapor lamps, and of fiberglass insulation.

BACKGROUND OF THE INVENTION

Various metal oxides, such as stannic oxide $SnO_2$, indium oxide $In_2O_3$, and cadmium stannate $Cd_2SnO_4$, have been the most widely used materials for forming transparent, electrically conductive coatings and layers.

The earliest methods of applying these coatings were based on spraying a solution of a metal salt (usually the chloride) on a hot surface, such as glass. In this way, satisfactory transparent, electrically resistive layers were first made for de-icing aircraft windows. However, the spray process produced rather corrosive by-products, hot chlorine and hydrogen chloride gases, which tended to attack the hot glass surface, producing a foggy appearance. U.S. Pat. No. 2,617,745 teaches that this undesirable effect can be mitigated by first applying a coating of pure silica on the glass. However, a silica protective layer is not very effective on glass with a high alkali content and high thermal expansion coefficient, such as common soda-lime glass. In addition, these corrosive by-products attack metal parts of the apparatus, and the metallic impurities, such as iron, may then be deposited in the coating, with deleterious effects on both the electrical conductivity and transparency of the coating.

Another problem has been a lack of uniformity and reproducibility in the properties of the coatings. U.S. Pat. No. 2,651,585 teaches that better uniformity and reproducibility are obtained when the humidity in the apparatus is controlled. The use of a vapor, rather than a liquid spray, as described for example in German Pat. No. 1,521,239, also results in more uniform and reproducible coatings.

Even with these improvements, more recent studies have been made using vacuum deposition techniques, such as evaporation and sputtering, in order to achieve cleaner and more reproducible coatings. Despite the much higher cost of these vacuum processes, the reduction of corrosive by-products and unwanted impurities introduced by the spray methods is felt to be important particularly in applications involving high-purity semiconductors.

The intentional addition of certain impurities is important in these processes, in order to achieve high electrical conductivity and high infrared reflectivity. Thus, tin impurity is incorporated in indium oxide, while antimony is added to tin oxide (stannic oxide) for these purposes. In each case the function of these desirable impurities ("dopants") is to supply "extra" electrons which contribute to the conductivity. The solubility of these impurities is high, and they can be added readily using all of the deposition methods referred to above. Fluorine has an advantage over antimony as a dopant for tin oxide, in that the transparency of the fluorine-doped stannic oxide films is higher than that of antimony-doped ones, particularly in the red end of the visible spectrum. This advantage of fluorine is important in potential applications to solar cells and solar thermal collectors. Despite this advantage of fluorine, most — and perhaps all — commercially available tin oxide coatings use antimony as a dopant. Possibly this is because fluorine doping has only been demonstrated in the less satisfactory spray method, whereas the improved deposition methods (chemical vapor deposition, vacuum evaporation and sputtering) are not believed to have been shown to produce fluorine doping. In addition, a recent report by a committee of experts in the American Institute of Physics Conference Proceedings No. 25, p. 288 (1975), concludes that fluorine equilibrium solubility in tin oxide is inherently lower than that of antimony. Nevertheless, it is noted that the lowest resistivity tin oxide films reported in the prior art are those of U.S. Pat. No. 3,677,814 to Gillery. Using a spray method, he obtained fluorine-doped tin oxide films with resistances as low as 15 ohms per square by utilizing a compound, as a starting material, which has a direct tin-fluorine bond. The lowest resistance in a commercially available tin-oxide coated glass is presently in the range of about 40 ohms per square. When one wishes to obtain coatings of as low as 10 ohms per square, one has heretofore been forced to use the much more expensive materials like indium oxide.

SUMMARY OF THE INVENTION

It is one object of the present invention to provide a process for depositing a layer or coating of fluorine-doped stannic oxide having a high visible transparency, high electrical conductivity and high infrared reflectivity.

Another object of the present invention is to allow the electrical conductivity to be varied easily during the deposition of a single such layer and to have the ability to achieve very low volume resistivities and surface resistances.

Another object of the present invention is to provide a noncorrosive deposition atmosphere, from which such layers of high purity may be deposited easily, and without contamination of the substrate by impurities or corrosive attack on the substrate or apparatus.

Still another object of the invention is to provide gaseous, rather than liquid, means for making coated products as described herein.

A further object of the present invention is to provide a process which easily produces such layers with highly uniform and reproducible properties over large areas without limitations inherent in spraying procedures.

Another object is to permit easy deposition of such layers inside tubes or bulbs, or over the surface of complicated shapes not easily sprayed.

Still other objects of the invention are to provide improved articles such as solar cells, other semiconductors useful in electrical circuitry, heat-reflective windows, improved sodium lamps and the like.

A further object of the present invention is to permit deposition of such layers with standard manufacturing processes in the semiconductor industry and glass industry.

Further objects and advantages will become apparent as the following description proceeds.

A particular feature of the invention is to select the reactants in such a way that the required tin-fluorine bond is not formed until the deposition is imminent. Thus, the tin fluoride material is better maintained in the vapor phase and at temperatures low enough that oxidation of the compound occurs only after the rearrangement to form a tin-fluorine bond. Films of fluorine-doped tin oxide, thus formed, have extraordinarily low electrical resistivity and extraordinarily high reflectivity to infrared wavelengths.

The process of the invention is carried out utilizing a gaseous mixture containing a volatile, organotin, fluorine-bearing compound which is free of any direct tin-fluorine bond. This mixture also contains a volatile oxidizable tin compound and an oxidizing gas. This first fluorine compound which is free of a fluorine-tin bond is converted into a second organotin fluoride compound having such a bond. Immediately after such conversion this second compound is oxidized to form a fluorine dopant and the dopant is oxidized along with the oxidizable tin compound to form a stannic oxide film with a controlled amount of fluorine impurity on said solid substrate.

In a first form of the invention, an organo-tin monofluoride vapor is formed in the heated deposition region by the reformation of the vapor of a more volatile compound containing both tin and fluoroalkyl groups bonded to tin.

A second advantageous embodiment of the invention utilizes an organo-tin monofluoride formed at or near the gas-substrate interface by reactions involving an organo-tin vapor and certain fluorine-containing gases having fluoroalkyl and/or fluorosulfur groups.

The product layer in each case is a uniform, hard, adherent, transparent coating whose electrical conductivity and infrared reflectivity depend on the concentration of the fluorine-containing dopant.

IN THE DRAWINGS

Figure 1:
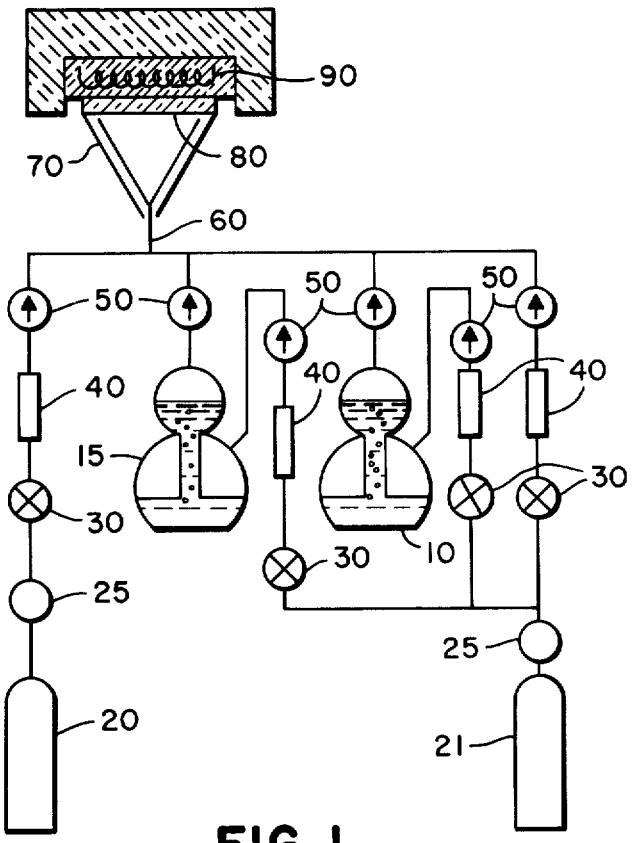
FIG. 1 shows a schematic diagram of an apparatus suitable for carrying out a process in which a fluorine dopant is an organo-tin fluoroalkyl vapor, evaporated from its liquid form.

The process of this invention has two main steps: (1) forming a reactive vapor mixture which will produce, on heating, a compound having a tin-fluorine bond, and (2) bringing this vapor mixture to a heated surface, on which fluorine-doped tin oxide deposits. The embodiments described below differ in the chemical source of the fluorine dopant in the reactive vapor mixture, and also in the means by which the vapor mixture is made. The second step (deposition on the heated surface) is largely the same in each example.

The tin is supplied by a volatile, oxidizable tin compound, such as tetramethyltin, tetraethyltin, dibutyltin diacetate, dimethyltin dihydride, dimethyltin dichloride, etc. The preferred compound is tetramethyltin, since it is sufficiently volatile at room temperature, non-corrosive, stable and easily purified. This volatile tin compound is placed in a bubbler marked 10 in the Figures, and an inert carrier gas, such as nitrogen, is bubbled through the tin compound. For the very volatile compounds, such as tetramethyltin and dimethyltin dihydride, the bubbler can be at room temperature, while for the other less volatile compounds, the bubbler and the tubing must be heated appropriately, as will be understood by those skilled in the art. It is one advantage of the instant invention that high-temperature apparatus can be avoided and that simple cold-wall supplies can be used.

The vapor mixture must contain an oxidizing gas, such as oxygen, nitrous oxide, or the like. Oxygen is the preferred gas, since it is readily available and works just as well as the more expensive alternate oxidizers.

The pressures of the gases are fixed by the regulators 25, and the flow rates of the oxygen from tank 20, and of the carrier gas from tank 21, are controlled by metering valves 30, and measured by flowmeters 40. The gas streams then pass through one-way check valves 50 into a mixing tube 60 and funnel-shaped chamber 70. A tin oxide film deposits on the hottest surface 80, which is heated by the heater 90, typically to temperatures about 400° to 600° C.

The general type of process just described is commonly known in the art as chemical vapor deposition. Various modifications, such as having the substrate surfaces vertical and rotating or below the reaction chamber and rotating, are known to those skilled in the art, and may be particularly suitable for use depending upon the geometry of the substrate or other conditions affecting a given application.

Rotation of the substrate is recommended in order to best move the sample through any convection currents which may occur in the apparatus and thereby best assure the uniformity of the deposited layers. However, it has now been discovered that, by placing the heated substrate facing downwardly, highly uniform coatings may be obtained more simply without rotation, because the gas, when heated from above, does not set up troublesome convection currents. Another advantage of having the substrate above the reactive vapors is that any dust or dirt, or powder byproduct formed by homogeneous nucleation in the gas, does not fall onto the growing film.

An invention described herein is an improved process by which controlled amounts of fluorine impurity may be introduced into the growing tin oxide film. In the simplest aspect of this invention, the fluorine dopant is a vapor containing one tin-fluorine bond in each molecule. The other three tin valences are satisfied by organic groups and/or halogens other than fluorine. Typical of such compounds is tributyltin fluoride. It has been discovered that the fluorine thus bound, and made available to a hot surface in vapor form, is not cleaved from the tin during oxidation at a hot surface.

Unfortunately, all known compounds with such a direct tin-fluorine bond are not significantly volatile near room temperature.

A particular advantage of the invention is achieved by forming the fluorine dopant from volatile compounds which do not have the required tin-fluorine bond, but which will rearrange on heating to form a direct tin-fluorine bond. This rearrangement advantageously occurs at temperatures high enough (e.g. > 100° C.) so that the tin fluoride thus formed remains in the vapor phase, but also low enough (e.g. < 400° C.) so that the oxidation of the compound occurs only after the rearrangement. One example of such a compound is trimethyl trifluoromethyltin, $(CH_3)_3SnCF_3$. On heating to a temperature of about 150° C. in a heated zone adjacent to the deposition surface 80, this compound rearranges to form a direct tin-fluorine bond, in $(CH_3)_3SnF$ vapor, which then reacts as the fluorine donor or dopant. Other compounds which undergo similar rearrangements at temperatures which will, of course, differ somewhat from compound to compound, have the general formula $R_3SnRF$, where R is a hydrocarbon radical, and RF is a fluorinated hydrocarbon radical having at least one fluorine atom bonded to that carbon atom which is bonded to the tin. The main advantage of these fluorine dopants is that they are volatile liquids, so that they can easily supply sufficient vapor pressure when evaporated at room temperature. This simplifies the design of the apparatus, as shown in FIG. 1, by eliminating the need for maintaining a warm zone between the bubbler 15 and the reaction chamber 70, to keep the fluorine dopant in the vapor phase. Thus the apparatus can be of the type which is usually called a "cold-wall chemical vapor deposition reactor," which is widely used, for example, in the semiconductor industry to deposit silicon, silicon dioxide, silicon nitride, etc. Another important feature of the "cold-wall reactor" for semiconductor applications is that it minimizes unwanted impurities at a low level in both the substrate and the deposited film. Similarly, in glass manufacture, the gas mixture can be added to the annealing and cooling oven at the stage when the glass is at the appropriate temperature, e.g. about 470° C. for soft glass. In this way, highly uniform films can be achieved in the normal glass-production equipment.

The preferred compound for use in the embodiment of FIG. 1 is $(CH_3)_3SnCF_3$, since it is more volatile than the compounds with more carbon atoms. It is a stable, colorless, non-corrosive liquid, which does not decompose in air at room temperature, and only reacts extremely slowly with water.

A particular advantageous second embodiment of the invention uses a fluorine-containing gas which reacts with an organo-tin vapor on heating, to produce a tin fluoride vapor. For example, α-fluoroalkyl halides, preferably wherein the alkyl group has 4 carbons or fewer, such gases as iodotrifluoromethane, $CF_3I$, $CF_3CF_2I$, $C_3F_7I$, and the like, can be mixed with organo-tin vapors such as tetramethyltin vapor $(CH_3)_4Sn$, at room temperature, i.e. to 90° F., and more preferably to temperatures of 150° F., without any reaction. Moreover, fluoroalkyl bromides like $CF_3Br$, $C_2F_5Br$ and the like are useful as fluorine-containing gases. They are less reactive and about 10 to 20 times more are required in the reactant gas, but they are much less expensive. This is particularly surprising because of the reputed inertness for such compounds. Fluoroalkyl chlorides are not favored for use because their reactivity in substantially lower than even the bromides.

When such a vapor mixture approaches the heated surface, reaction takes place in the gas phase to, eventually, produce the desired tin-fluorine bonds. Although the reaction sequence is complex, it is believed to begin by reactions such as $$CF_3I + R_4Sn \rightarrow R_3SnCF_3 + RI$$

to yield the organo-tin fluoroalkyl $R_3SnCF_3$ vapors in the region near the interface of the hot surface, where they serve as fluorine dopants for the growing tin oxide film, just as in the first embodiment.

Certain other fluorine-containing gases also function in this second embodiment of the invention. For example, sulfur chloride pentafluoride, $SF_5Cl$, is an effective fluorine donor gas, as is sulfur bromide pentafluoride $SF_5Br$.

In a similar way, tri fluoromethyl sulfur pentafluoride $CF_3SF_5$ gas acts to form tin-fluoride bonds by gas phase reactions.

Figure 2:
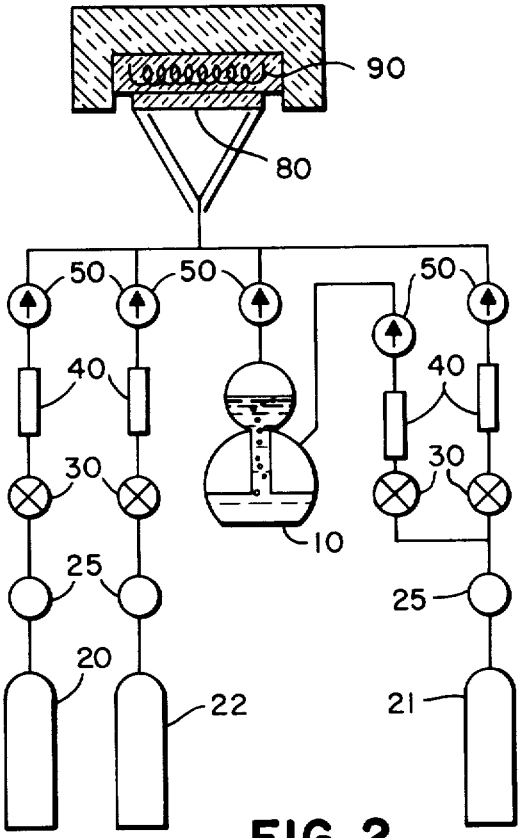
FIG. 2 shows a similar diagram for the second embodiment, in which the fluorine dopant is formed by reaction with certain fluoroalkyl and/or fluorosulfur gases supplied from a compressed gas cylinder.

The advantage of this second embodiment is that the fluorine donor is a gas, and the process is further shown in FIG. 2. The preferred gases are $CF_3I$ and $CF_3Br$, which are non-corrosive, nonflammable, not appreciably toxic, and readily available commercially. $SF_5Cl$ and $SF_5Br$ and highly toxic, and thus are less desirable for use. $CF_3SF_5$ is non-toxic, but somewhat less reactive than $CF_3I$.

Figure 3:
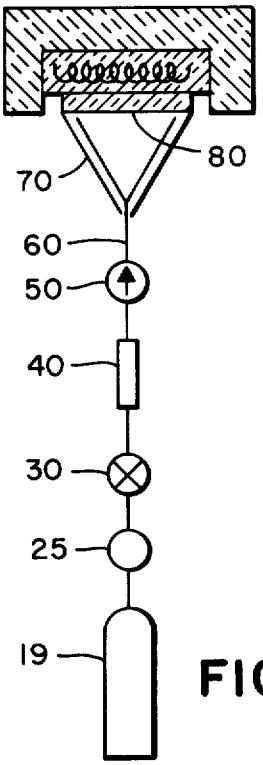
FIG. 3 shows a simplified version of the apparatus for practicing either the first or the second embodiments of the invention.

The deposition process may be further simplified, as shown in FIG. 3, if the gas mixtures are pre-mixed and stored in a compressed gas cylinder 19. For safe storage and use, the oxidizable compound must of course be kept at a concentration such that it cannot form an explosive mixture. For example, the lower explosion limit of tetramethyltin in air is about 1.9%. The concentrations which I have used for the chemical vapor depositions are less than a ½ of this level. In addition, the use of $CF_3I$ or $CF_3Br$ as a fluorine dopant incidentally acts as a flame suppressant.

Films prepared according to the invention are found to have infrared reflectivities of 90% and more measured, as is known in the art, at the conventional 10-micron wave length of light which is characteristic of thermal infrared radiation at room temperature. This 90% reflectivity is to be compared to the 80% reflectivity which is heretofore achieved using tin oxide coatings. In usual practice, these infrared reflective layers will be from about 0.2 to 1 micron in thickness; thicknesses of 0.3 to 0.5 microns are typical.

In order to characterize more quantitatively the fluorine doping levels in the films, the infrared reflectivity was measured over the wavelength range of 2.5 microns to 40 microns. By fitting these data with theoretical curves, as described in detail by R. Groth, E. Kauer and P. C. van den Linden, "Optical Effects of Free Carriers in $SnO_2$ Layers," Zeitschrift fur Naturforschung, Volume 179, pages 789 to 793 (1962), values were obtained for the free electron concentration in the films. The values obtained were in the range from $10^{20}$ $cm^{-3}$ to $10^{21}$ $cm^{-3}$, and increased regularly with increasing concentrations of the fluorine dopant. Theoretically, one free electron should be released for each fluorine atom which replaces an oxygen atom in the lattice. This hypothesis was verified by Auger Electron Spectroscopic measurements of the total fluorine concentration in some of the films, which gave fluorine concentrations in agreement with the free electron concentrations, to within the experimental uncertainties. This agreement is indicative that most of the incorporated fluorine is electrically active.

The infrared reflectivity at 10 microns, and also the bulk electrical conductivity of the films, were found to be maximum at a doping level of about 1.5–2% fluorine substitution for oxygen. The maxima are very broad, and almost maximum conductivities and reflectivities are shown by films with 1% to 2.5% fluorine. There is also a weak, broad absorption throughout the visible wavelength range, which increases directly with fluorine concentration. Therefore, to prepare films with high electrical conductivity and high visible transparency, a fluorine concentration in the film of about 1% (i.e., fluorine to oxygen ratio 0.01 in the film) is most desirable. However, this optimum will vary somewhat, depending on the spectral distribution of interest in a given application. By varying the fluorine dopant concentration, routine experimentation can easily establish the optimum percentage for any given application.

Fluorine doping levels exceeding 3% can easily be achieved in the films, using the methods of the instant invention. Prior art results had not exceeded 1%, and the opinion, cited above, was that this was the solubility limit for fluorine. While such high doping levels are not needed to produce optimum infrared reflectivity or electrical conductivity, the gray films produced at doping levels of 2% or more may be useful on architectural glass, for limiting solar heat gain in air-conditioned buildings. In such applications, the doping level at the surface of the film advantageously is reduced to about 2%, in order to have maximum infrared reflectivity.

Using the measured electron concentrations and electrical conductivities, the electron drift mobilities can be obtained. For various films, values from 50 to 70 $cm^2$/Volt-sec were calculated in this way. Previously obtained mobility values for tin oxide films have ranged from 5 to 35 $cm^2$ /Volt-sec. It is believed the instant films are the first to have such mobilities exceeding 40 $cm^2$/Volt-sec. These values illustrate, in another way, the superior quality of the process of this invention and of the films prepared therewith.

The process of the invention is also highly desirable for use in making novel devices such as those having electroconductive layers in semiconductor manufacture (e.g. integrated circuits and the like), and also the manufacture of heat-reflective transparent objects like windows.

The most advantageous mode of the invention is that wherein the organo-tin fluoride compound having a tin-fluorine bond is decomposed at the substrate immediately after formation. This decomposition is preferably in a narrow reaction zone which is largely heated to the decomposition temperature by heat from the substrate itself.

ILLUSTRATIVE EMBODIMENT OF THE INVENTION

In order to point out more fully the nature of the present invention, the following examples are given as illustrative embodiments of the present process and products produced thereby.

Unless otherwise specified, the specific examples disclosed below are carried out according to the following general procedure:

EXAMPLE 1

The process is exemplified by an experiment using the apparatus of FIG. 1 to produce a gas stream which contains 1% tetramethyltin $(CH_3)_4Sn$, 0.02% trimethyl trifluoromethyltin $(CH_3)_3SnCF_3$, 10% nitrogen carrier gas, and balance oxygen gas. The resulting stream is passed over a pyrex glass plate which is 15 cm in diameter and maintained at 500° C. for about a 5 minute deposition period. The flow rate of the gas stream is about 400 cc per minute. This flow rate is such that the gas turnover rate in funnel 70 is about once each two minutes. A transparent film about 1 micron thick is deposited. It shows electrical resistance of 2 ohms per square, corresponding to a volume resistivity of 0.0002 ohm-cm. This film is measured to have a fluorine to oxygen ratio of about 0.017 and a drift mobility of about 50 $cm^2$/Volt-sec.

EXAMPLE 2

When the process of Example 1 is repeated using a sodium free silicon substrate, the resistance value dropped to about 1 ohm per square, i.e. about one-half the value of the resistivity achieved with a sodium-bearing substrate.

EXAMPLE 3

An advantageous process is illustrated by a process utilizing the apparatus of FIG. 2. The resulting gas mixture consists of 1% tetramethyltin $(CH_3)_4Sn$, 0.2% iodotrifluoromethane $CF_3I$, 20% nitrogen carrier gas, balance oxygen. Films grown on pyrex glass substrates showed the same electrical characteristics as in Example 1.

EXAMPLE 4

The simplified apparatus in FIG. 3 is used by forming the mixture described in Example 3, in a compressed gas cylinder 19. The results are identical to those of Example 3. After a month of storage in the gas cylinder, the experiment was repeated, giving identical results. This demonstrates the stability and shelf life of this mixture.

EXAMPLE 5

Example 3 is repeated, except that when the stannic oxide film is 0.5 microns thick, deposition is stopped. The resulting stannic oxide film has an infra-red reflectivity of about 90%.

EXAMPLES 6–13

The following gases each are substituted, in equimolecular portions, for $CF_3I$ in the procedure of Example 3 (excepting that the concentration of fluorine dopants is increased 15 times in examples 6, 7, 8 and 13.) Excellent conductivity and infra-red reflectivity are achieved:

| Example | Gas | Example | Gas |
|---|---|---|---|
| 6 | $CF_3Br$ | 10 | $C_3F_7I$ |
| 7 | $C_2F_5Br$ | 11 | $SF_5Br$ |
| 8 | $C_3F_7Br$ | 12 | $SF_5Cl$ |
| 9 | $C_2F_5I$ | 13 | $CF_3SF_5$ |

Conventional silicon photovoltaic cells ("Solar cells") have heretofore comprised typical surface resistances of 50 to 100 ohms per square. In order to have an acceptably low total cell resistance, a metallic grid with a spacing of 1 or 2 millimeters is deposited on the silicon surface. By depositing a fluorine-doped tin-oxide layer with a sheet resistance of about 0.5 ohms per square (about 2 microns thick) on the cell surface, the metallic grid spacing can be increased to about 10 millimeters, with a corresponding reduction in the cost of the grid. Alternatively, the grid size can be kept small, and the cell is able to function efficiently even when the sunlight has been concentrated by a factor of about 100, provided adequate cooling of the cell is maintained.

Figure 4:
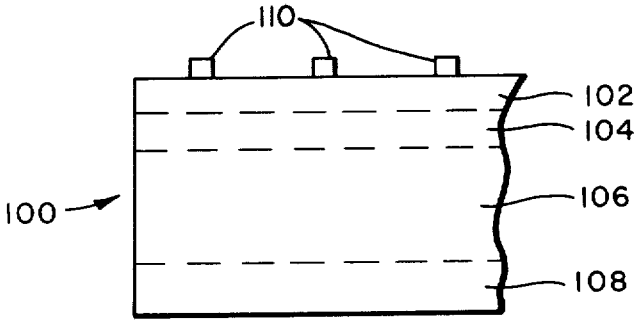
FIG. 4 is a schematic section of a solar cell and illustrates one use of the invention in a semiconductor application.
Figure 5:
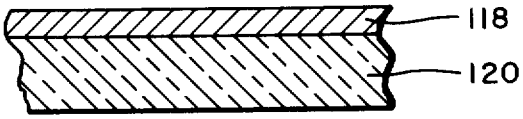
FIG. 5 shows window 120 coated with layer 118 according to the invention.

A schematic section 100 of such a cell is shown in FIG. 4 wherein a 2-micron layer 102 of n-$SnO_2$ (the fluorine-doped material of the invention is used), a 0.4 micron layer 104 of n-silicon (phosphorous-doped silicon as known to the art), a 0.1 mm p-silicon layer 106 (boron-doped silicon as known to the art) are joined with an aluminum layer 108 serving as an electrode. Metallic grids 110 are spaced about 10 millimeters apart. Yet an excellent performance is achieved.

The deposited layers can be used in manufacture of other semiconductor articles, e.g. conductors or resistors. Tin-oxide coatings have been so used in integrated circuits before. The improved conductivity will allow wider application of this material in the future. Not only is the sheet resistance range extended to much lower values (e.g. about 5 ohms per square or less) than herefore possible, but also deposition of the layer can be achieved within the same apparatus which is used, for example, to grow epitaxial silicon. This eliminates the costly and cumbersome unloading, cleaning, and loading steps between depositions.

The resistivity values obtained for the fluorine-doped tin-oxide on silicon substrates are about $10^{-4}$ ohm-cm, which is comparable to that of evaporated tantalum metal, which is sometimes used for connections in integrated circuits. The good match between thermal expansion coefficients of tin-oxide and silicon allows deposition of thick layers without significant strains.

Figure 6:
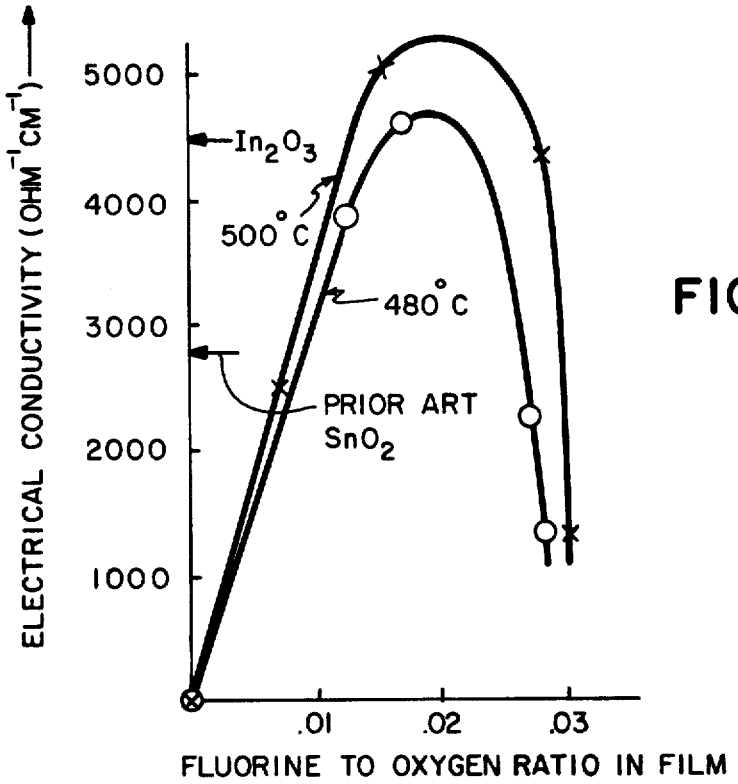
FIGS. 6 and 7 are graphs illustrative of varying conductivity and reflectivity with concentrations of fluorine dopant.

FIG. 6 shows the electrical conductivity of the fluorine-doped stannic oxide films as a function of measured fluorine to oxygen ratio in the films, for deposition temperatures of 480° C. and 500° C.

Figure 7:
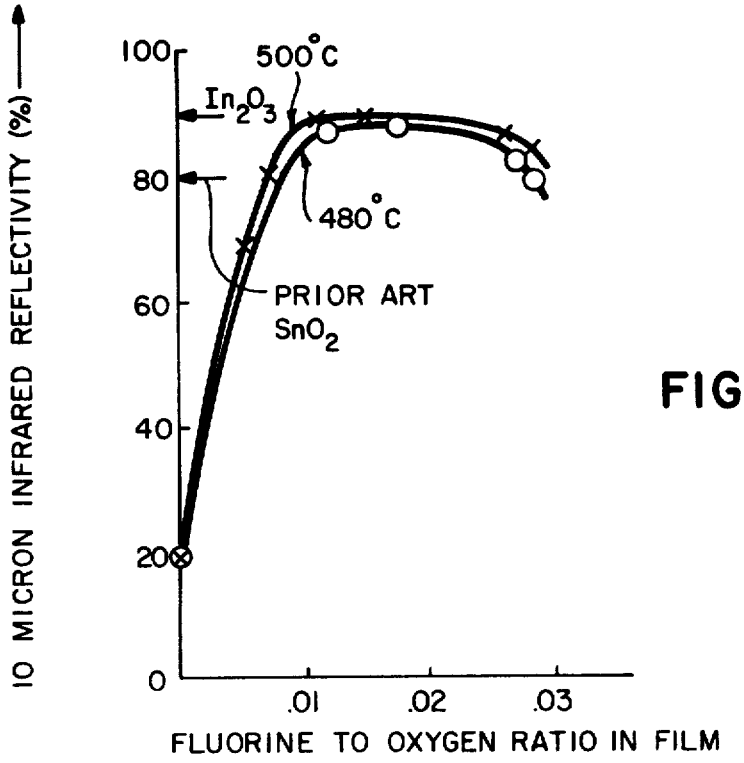

FIG. 7 shows the infra-red reflectivity of the fluorine-doped stannic oxide films as a function of measured fluorine to oxygen ratio in the films, for deposition temperatures of 480° C. and 500° C.

Also indicated on FIGS. 6 and 7 are (1) the conductivity of the expensive indium-oxide materials known to the art and as described in Philips Technical Review, Vol. 29, Page 17 (1968) by van Boort and Groth and (2) the best alleged prior art values for conductivity and reflectivity of doped stannic oxide coatings.

Although several embodiments of the present invention have been described and illustrated, it will be apparent to those skilled in the art that various changes and further modifications may be made therein without departure from the spirit of the invention or from the scope of the appended claims.

What is claimed is:

1. A process for making transparent films of stannic oxide on a heated substrate using a gaseous mixture initially containing (1) a first organotin fluorine-bearing compound which is free of any direct tin-fluorine bond (2) an oxidizable, tin compound, and (3) an oxidizing gas said process comprising the steps of:

(a) converting said first organotin fluorine-bearing component of said gaseous mixture into a second organotin fluoride gaseous compound having a direct tin-to-fluorine bond;

(b) immediately oxidizing, in immediate proximity to said substrate, the second fluoride compound to obtain a fluorine dopant in the gaseous mixture;

(c) and forming a fluorine doped stannic oxide film, on said heated substrate, by simultaneous deposition thereon of said oxidizable tin compound and said fluorine dopant.

2. A process as defined in claim 1 wherein said first organotin fluorine-bearing gaseous compound is formed by heating a gas mixture containing (a) a gas selected from the group consisting of $CF_3I$, $CF_3Br$, and $CF_3SF_5$ and homologous alkyl alpha-fluorinated compounds of said $CF_3I$, $CF_3Br$ and $CF_3SF_5$, $SF_5Br$, and $SF_5Cl$; or mixtures thereof and (b) said oxidizable tin compound, and wherein (a) and (b) are substantially inert with respect to one another at temperatures below about 150° F.

3. A process as in claim 2 in which a mixture of (a) and (b) is stable at about 90° F., but wherein a reaction of (a) and (b) is thermally initiated and forms an organotin monofluoride vapor; said vapor forming a source for controlled addition of fluorine impurity to said film of stannic oxide.

4. A process as in claim 3 in which the fluorine dopant is formed by reacting trifluoroiodomethane and an organotin compound containing at least one tin-carbon bond per molecule.

5. A process as in claim 4 in which the fluorine dopant is forming a reacting trifluoroidomethane gas and tetramethyltin.

6. A process as in claim 5 wherein bromine is substituted for iodine.

7. A process as in claim 4 in which bromine is substituted for iodine.

8. A process as in claim 3 in which the fluorine dopant is formed by reacting sulfur chloride pentafluoride gas and an organo-tin compound containing at least one tin-carbon bond per molecule.

9. A process as in claim 8 in which the fluorine dopant is formed by reacting sulfur chloride pentafluoride gas and tetramethyltin.

10. A process as in claim 3 in which the fluorine dopant is formed by reacting trifluoromethyl sulfur pentafluoride gas and an organo-tin compound containing at least one tin-carbon bond per molecule.

11. A process as in claim 10 in which the fluorine dopant is formed by reacting trifluoromethyl sulfur pentafluoride gas and tetramethyltin.

12. A process as defined in claim 1 wherein said conversion of said first volatile organotin fluorine-bearing compound which is free of any direct tin-fluorine bond, into said organotin fluoride gaseous compound having a direct tin-fluorine bond, takes place on heating by said substrate.

13. A process as defined in claim 1 wherein said substrate to be coated faces downwardly and said gaseous mixture is directed upwardly toward said surface.

14. A process as in claim 1 in which tetramethyltin vapor, at concentrations up to about one percent, is the volatile oxidizable tin compound; oxygen gas, at partial pressures up to about one atmosphere, is the oxidizing gas; and said stannic oxide is deposited on a surface heated at about 500° C.

15. A process as in claim 1 in which said first fluorine-bearing compound is a volatile tin compound which decomposes on heating to form an organotin monofluoride vapor.

16. A process as in claim 9 in which said volatile tin compound is trimethyl trifluoromethyl tin.

17. A process as in claim 9 in which the volatile tin compound is trimethyl pentafluoroethyl tin.

18. A process as defined in claim 1 wherein the ratio of fluorine dopant and oxidizable tin compound are selected that the free [election] *electron* concentration of the films is within about a range of from $10^{20}cm^{-3}$ to $10^{21}cm^{-3}$.

19. A process as defined in claim 1 wherein fluorine dopant levels in said stannic oxide film are about 1% to 3% fluorine substituted for oxygen.

20. A process for depositing transparent, fluorine-doped, tin-oxide films, on a heated substrate said process comprising the steps of (1) supplying a continuous stream of a reagent gas to the vicinity of said substrate, said reagent gas containing reagents which are convertible to an organotin fluoride compound having a direct tin-fluorine bond in the immediate proximity of said heated substrate, and (2) depositing said organotin fluoride compound with an oxidizable tin component of said reagent gas at the surface of said substrate and thereby achieving a fluorine-doped, tin oxide coating upon said surface.

21. A process for depositing films of fluorine-doped stannic oxide on a heated substrate, said process comprising mixing (a) a gaseous, fluorine-bearing component, and (b) a gaseous, oxidizable tin-bearing component, and (c) a gaseous, oxygen-bearing component, and, optionally, (d) inert carrier gas these components being selected so that they remain in the gas phase at the temperature of mixing and wherein component (a) forms a compound with a tin-fluorine bond only as the gas mixture is heated to about the temperature of said heated substrate, said compound with a tin-fluorine bond and said oxygen bearing component then reacting to deposit said film of fluorine-doped stannic oxide on said heated substrate, and wherein said component (a) contains a volatile organotin fluorine-bearing compound which is free of any direct tine-fluorine bond but which rearranges on heating to form a direct tin-fluorine bond at temperatures high enough so that the newly-formed compound with a direct tin-fluorine bond remains in the vapor phase until it reacts along with the oxidizable tin compound to deposit a film of fluorine-doped tin oxide.

22. A process as in claim 21, in which component (a) contains a fluoroalkyl group or substituted fluoralkyl group, bonded to a tin atom.

23. A process as in claim 22 in which component (a) contains trimethyl trifluoromethyl tin.

24. A process as in claim 23 in which component (b) contains an organometallic tin compound.

25. A process as in claim 24 in which component (b) contains tetramethyl tin.

26. A process as in claim 22 in which component (a) contains trimethyl pentafluoroethyl tin.

27. A process as in claim 22 in which component (b) contains an organometallic tin compound.

28. A process as in claim 27 in which component (b) contains tetramethyl tin.

29. A process as in claim 21 in which component (b) contains a compound containing at least one carbon-tin bond.

30. A process as in claim 29 in which component (b) contains tetramethyl tin.

31. A process as in claim 29 in which component (b) contains dimethyl tin dichloride.

32. A process as in claim 21, in which component (b) contains an organometallic tin compound.

33. A process as in claim 32 in which component (b) contains tetramethyl tin.

34. A process for depositing films of fluorine-doped stannic oxide on a heated *substrate* said process comprising mixing (a) a gaseous, fluorine-bearing component, and (b) a gaseous, oxidizable tin-bearing component, and (c) a gaseous, oxygen-bearing component, and, optionally, (d) inert carrier gas these components being selected so that they remain in the gas phase at the temperature of mixing and wherein component (a) and component (b) react to form a compound with a tin-fluorine bond only as the gas mixture is heated to about the temperature of said heated substrate, said compound with a tin-fluorine bond and said oxygen bearing component then reacting to deposit said film of fluorine-doped stannic oxide on said heated substrate in which component (a) contains reactive fluoroalkyl groups and in which component (b) contains an organometallic tin compound.

35. A process as in claim 34 in which component (a) contains fluoroalkyl halides, or mixtures thereof.

36. A process as in claim 35 in which component (a) contains a gas selected from the group consisting of $CF_3Br$, $CF_3I$ and homologous or substituted fluorinated compounds, or mixtures thereof.

37. A process as in claim 36 in which component (b) contains an organometallic tin compound.

38. A process as in claim 37 in which component (b) contains tetramethyltin.

39. A process as in claim 37 in which component (b) contains dimethyl tin dichloride.

40. A process as in claim 35 in which component (b) contains an organometallic tin compound.

41. A process as in claim 40 in which component (b) contains tetramethyl tin.

42. A process as in claim 34, in which component (a) contains reactive fluorosulfur groups.

43. A process as in claim 34 in which component (b) contains tetramethyl tin.

44. A process for depositing films of fluorine-doped stannic oxide on a heated substrate said process comprising mixing (a) a gaseous, fluorine-bearing component, and (b) a gaseous, oxidizable tin-bearing component, and (c) a gaseous, oxygen-bearing component, and, optionally, (d) inert carrier gas these components being selected so that they remain in the gas phase at the temperature of mixing and wherein component (a) and component (b) react to form a compound with a tin-fluorine bond only as the gas mixture is heated to about the temperature of said heated substrate, said compound with a tin-fluorine bond and said oxygen bearing component then reacting to deposit said film of fluorine-doped stannic oxide on said heated substrate; in which component (a) contains reactive fluorosulfur groups; and in which component (b) contains an organometallic tin compound.

45. A process as in claim 44 in which component (b) contains tetramethyl tin.

46. A process for depositing films of fluorine-doped stannic oxide on a heated substrate said process comprising mixing (a) a gaseous, fluorine-bearing component, and (b) a gaseous, oxidizable tin-bearing component, and (c) a gaseous, oxygen-bearing component, and, optionally, (d) inert carrier gas these components being selected so that they remain in the gas phase at the temperature of mixing and wherein component (a) and component (b) react to form a compound with a tin-fluorine bond only as the gas mixture is heated to about the temperature of said heated substrate, said compound with a tin-fluorine bond and said oxygen bearing component then reacting to deposit said film of fluorine-doped stannic oxide on said heated substrate;

in which component (a) contains reactive fluorosulfur groups selected from $SF_5Cl$, $SF_5Br$, or $SF_5CF_3$, and homologous or substituted compounds or mixtures thereof; and in which component (b) contains organometallic tin compound.

47. A process as in claim 46 in which component (b) contains tetramethyl tin.

*48. A process as defined in claim 34 wherein the amounts of said fluorine bearing component and said oxidizable tin compound are selected so that said films have a free electron concentration within about the range of from $10^{20}cm^{-3}$ to $10^{21}cm^{-3}$.*

*49. A process as defined in claim 34 wherein levels of said fluorine dopant in said stannic oxide film are about 1% to 3% fluorine substituted for oxygen.*

*50. A process as in claim 48 in which component (a) contains fluoroalkyl halides, or mixtures thereof.*

*51. A process as in claim 48 in which component (a) contains a gas selected from the group consisting of $CF_3Br$, $CF_3I$ and homologous or substituted fluorinated compounds or mixtures thereof.*

*52. A process as in claim 48 in which component (b) contains an organometallic tin compound.*

*53. A process as in claim 49 in which component (a) contains fluoroalkyl halides, or mixtures thereof.*

*54. A process as in claim 49 in which component (a) contains a gas selected from the group consisting of $CF_3Br$, $CF_3I$ and homologous or substituted fluorinated compounds or mixtures thereof.*

*55. A process as in claim 49 in which component (b) contains an organometallic tin compound.*

* * * * *